United States Patent [19]
Adduci et al.

[11] Patent Number: 6,160,416
[45] Date of Patent: Dec. 12, 2000

[54] FULL CMOS SLEW RATE CONTROLLED INPUT/OUTPUT BUFFER

[75] Inventors: Francesco Adduci, Milan; Fabrizio Stefani, Cardano al Campo, both of Italy

[73] Assignee: STMicroelectronics S.r.l., Agrate Brianza, Italy

[21] Appl. No.: 09/205,037

[22] Filed: Dec. 4, 1998

[30] Foreign Application Priority Data

Dec. 4, 1997 [IT] Italy .................................. TO97A1060

[51] Int. Cl.$^7$ .......................................... H03K 19/0185
[52] U.S. Cl. ................................. 326/21; 326/87; 326/27; 326/83
[58] Field of Search .................... 326/83, 86, 21, 326/26, 27, 30, 87

[56] References Cited

U.S. PATENT DOCUMENTS

| | | | |
|---|---|---|---|
| 5,045,722 | 9/1991 | Yang et al. | 326/83 |
| 5,153,457 | 10/1992 | Martin et al. | 326/83 |
| 5,166,558 | 11/1992 | Ohsawa | 326/83 |
| 5,598,119 | 1/1997 | Thayer et al. | 326/83 |
| 5,717,343 | 2/1998 | Kwong | 326/83 |
| 5,789,937 | 8/1998 | Cao et al. | 326/86 |
| 5,877,647 | 3/1999 | Vajapey et al. | 326/87 |
| 5,914,618 | 6/1999 | Mattos | 326/83 |

*Primary Examiner*—Michael Tokar
*Assistant Examiner*—Don Phu Le
*Attorney, Agent, or Firm*—Theodore E. Galanthay; Stephen C. Bongini; Fleit, Kain, Gibbons, Gutman & Bongini P.L.

[57] ABSTRACT

An output buffer circuit including an input node, an output stage, an output node that is connected to the output stage, and a control circuit that controls voltage variations during the rising and falling edges of the output signal. The control circuit compares the levels of the input signal and the output signal and drives the output stage. In a preferred embodiment, the control circuit includes first and second logic circuits that are each connected to the input and output nodes. The first logic circuit selectively enables operation of a first driving circuit, and the second logic circuit selectively enables operation of a second driving circuit. Additionally, a method for slew rate control during rising and falling edges of an output signal of an output buffer circuit is provided. According to the method, the level of the output signal and the level of the input signal are compared. If the input and output signals have different levels, a current is injected into or taken from the output node. In one preferred method, the current is injected or taken by controlling a first driving circuit so as to inject a current into the output node or controlling a second driving circuit so as to take a current from the output node.

25 Claims, 3 Drawing Sheets

FULL CMOS SLEW RATE CONTROLLED INPUT/OUTPUT BUFFER

CROSS-REFERENCE TO RELATED APPLICATIONS

This application is based upon and claims priority from prior Italian Patent Application No. TO97-A001060, filed Dec. 4, 1997, the entire disclosure of which is herein incorporated by reference.

BACKGROUND OF THE INVENTION

1. Field of the Invention

The present invention relates to integrated circuits, and more specifically to integrated circuits having output buffers.

2. Description of Related Art

In conventional CMOS output buffers, bouncing during level switching is caused by a combination of reactive components such as the buffer's output capacitance and load and the reactance of the inductive case, the leads, the bondings, and the related solderings. Because the resistance of the MOS output transistors is usually insufficient to satisfactorily dampen such bouncing, there is an increase in the current that is injected into the PMOS and NMOS circuit elements and an increase in the switching noise.

Further, in devices that are suitable for audio-radio applications, additional problems are caused because the oscillations can propagate to other circuits (e.g., multipliers, demodulators, oscillators, and phase-locked loops) that operate at high frequencies. As a result, undesired effects can be caused by reactive phenomena inherent in the structure that includes the buffer, connection pad, and bonding. Additionally, due to inductive leads, buffers using uncontrolled fast switching can generate oscillations in output signals so as to cause severe timing errors in the downstream circuits.

To overcome such problems, a circuit designer must take the measures necessary to correctly buffer the signals. When there is a need to charge high capacities, suitable techniques such as a slew rate control must be used in the driving buffers. For example, U.S. Pat. No. 5,121,000 discloses a CMOS output buffer circuit that has an output signal with low bouncing and a feedback circuit including a capacitor. The capacitor acts substantially as a damping factor for the bouncing and control is only applied on the pull-down transistor.

Additionally, U.S. Pat. No. 5,311,077 discloses an output buffer circuit in which slew rate control is used to substantially maintain a constant charge and discharge current independent of temperature conditions and the supply voltage. The circuit is divided into two branches that can individually charge and discharge the output stage gates with a constant current. The switching of the circuit is only controlled by input signal variations so no control is applied on the output signal status. Further, the signal is obtained by a hybrid technique that is quite complex to implement.

U.S. Pat. No. 5,619,147 also discloses a CMOS output buffer circuit with slew rate control. The circuit has a feedback circuit connected to the output to control the variation rate of the output signal during the rising and falling edges of the signal. In particular, the feedback circuit includes a capacity and a differential pair of MOS transistors. By appropriately sizing the capacity and the aspect factors of the MOS transistors, both the rising and falling edges can be set up according to desired noise characteristics. However, the buffer circuitry is difficult to implement. Careful design of the MOS transistors is required because the circuit is based on a time constant RC that results from the sizing of the MOS transistors. Thus, the circuit design is not very flexible.

SUMMARY OF THE INVENTION

In view of these drawbacks, it is an object of the present invention to remove the above-mentioned drawbacks and to provide an output buffer circuit in which efficient slew rate control during the rising and falling edges of the output signal is achieved in a simple manner.

Another object of the present invention is to provide an output buffer circuit that performs output voltage control through standard digital circuits.

Yet another object of the present invention is to provide an output buffer circuit that allows various output voltage rates to be set.

Still another object of the present invention is to provide an output buffer circuit having lower energy consumption.

One embodiment of the present invention provides an output buffer circuit that includes an input node, an output stage, an output node that is connected to the output stage, and a control circuit that controls voltage variations during the rising and falling edges of the output signal. The control circuit compares the levels of the input signal and the output signal and drives the output stage. In a preferred embodiment, the control circuit includes first and second logic circuits that are each connected to the input and output nodes. The first logic circuit selectively enables operation of a first driving circuit, and the second logic circuit selectively enables operation of a second driving circuit.

Another embodiment of the present invention provides a method for slew rate control during rising and falling edges of an output signal of an output buffer circuit. According to the method, the level of the output signal and the level of the input signal are compared. If the input and output signals have different levels, a current is injected into or taken from the output node. In one preferred method, the current is injected or taken by controlling a first driving circuit so as to inject a current into the output node or controlling a second driving circuit so as to take a current from the output node.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
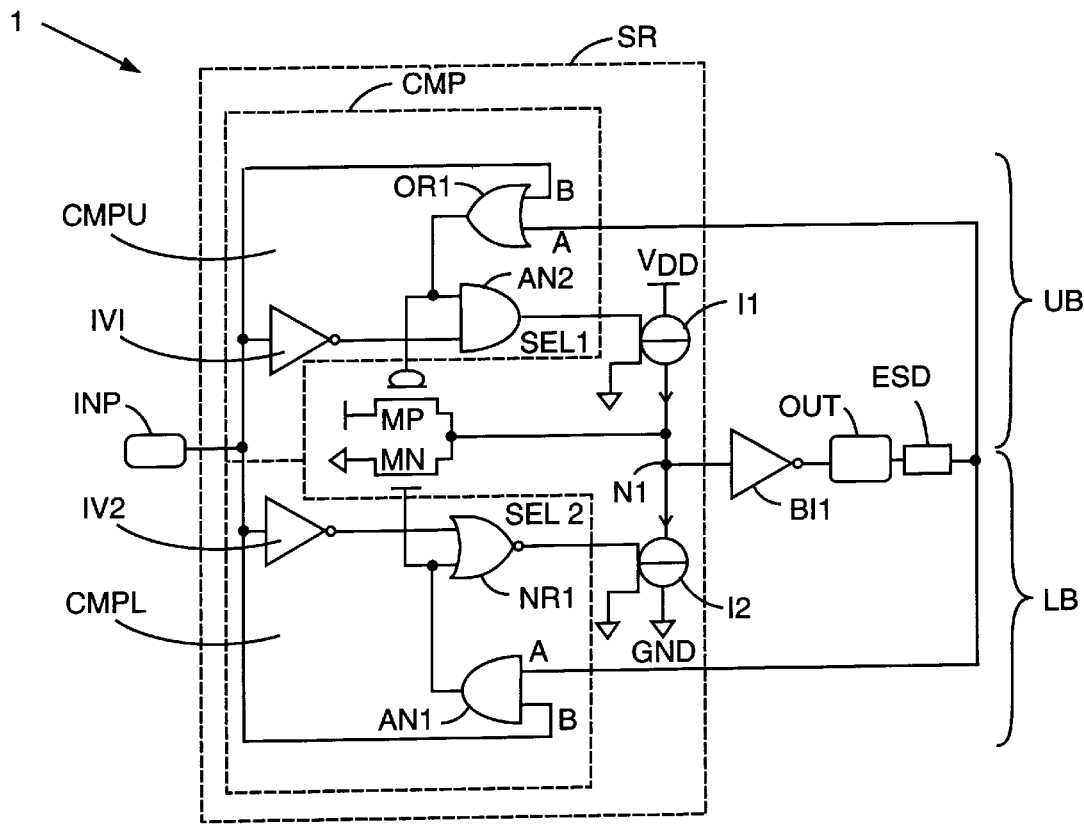
FIG. 1 is a block diagram of an output buffer circuit with slew rate control according to an embodiment of the present invention.

FIG. 1 shows an output buffer circuit with slew rate control according to an embodiment of the present invention. The output buffer circuit 1 is substantially divided in two branches: an upper branch UB and a lower branch LB. The buffer has an enabling input node INP and a first inverter IV1 in the upper branch UP is connected to the input node INP. A first AND gate AN2 has a first input connected to the output of the first inverter IV1 and a second input connected to the output of an first and gate OR1. The gate of a PMOS transistor MP is also connected to the second input of the OR gate. The output SEL1 of the first AND gate AN2 controls a first current source I1 that has one pole connected to a supply voltage $V_{DD}$ and another pole connected to a node N1. The source electrodes of the PMOS transistor MP and an NMOS transistor MN are connected to the node N1.

Additionally, the node N1 is connected to the input of a second inverter BI1 that represents the actual output buffer. In other words, the output of the second inverter BI1 forms the output node OUT of the output buffer circuit 1. An electrostatic discharge protection circuit ESD is connected to the output node OUT. The OR gate OR1 has one input A that is connected to the output of the electrostatic discharge protection circuit ESD and another input B that is connected to the input node INP. The lower branch LB, which is similar to the upper branch UB, has a third inverter IV2 that is connected to the input node INP. A NOR gate NR1 has a first input that receives the output of the third inverter IV2 and a second input that receives the output of a second AND gate AN1. The gate of the NMOS transistor MN is also connected to the second input of the NOR gate. The output SEL2 of the NOR gate NR1 controls a second current source I2 that has one pole connected to ground GND and another pole connected to the node N1.

With the second inverter BI1 forming the actual output buffer as explained above, it is possible to identify a slew rate control circuit SR that is fitted for each branch (i.e., the upper branch UB or the lower branch LB) with an input on the input node INP and an output on the output node. The slew rate control circuit SR includes the OR gate OR1, first inverter IV1, first AND gate AN2, and first current source I1 of the upper branch UB, and the second AND gate AN1, NOR gate NR1, third inverter IV2, and second current source I2 of the lower branch LB. The node N1 is the output of the slew rate control circuit SR.

Figure 2:
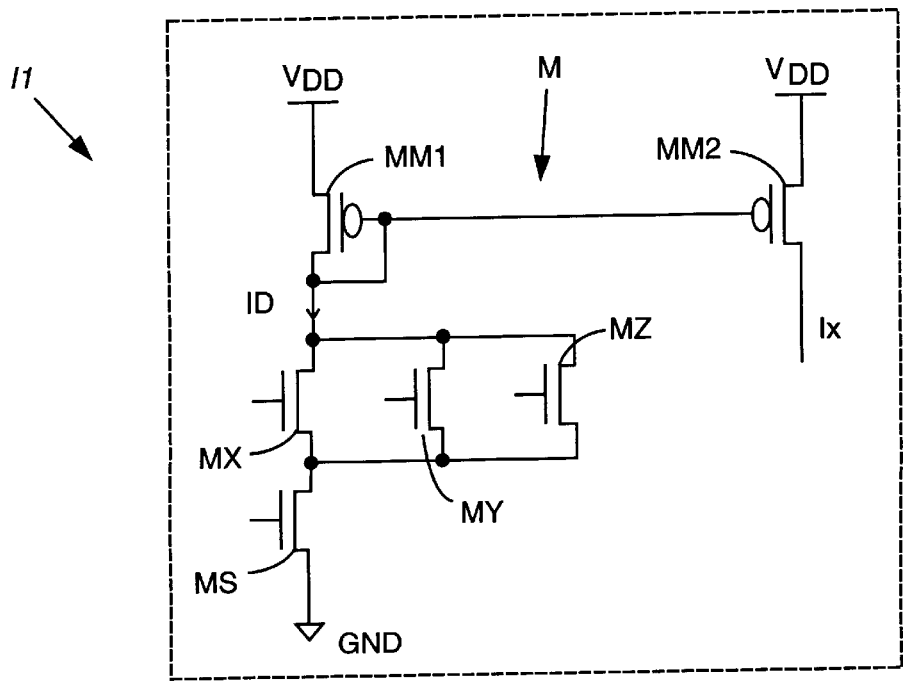
FIG. 2 is a schematic diagram of a portion of the output buffer circuit of FIG. 1.

FIG. 2 shows an exemplary embodiment of the first current source of the output buffer circuit of FIG. 1. As shown, the current source I1 has a current mirroring circuit M that includes two PMOS channel transistors MM1 and MM2. The second PMOS transistor MM2 has an aspect ratio (i.e., a ratio of channel width to channel length) that is m times the aspect ration of the first PMOS transistor MM1. Thus, m is known as a mirroring multiplier ratio. Further, three MOS transistors MX, MY, and MZ are connected to the drain of the first PMOS transistor drain MM2 to receive the current $I_D$ that is to be multiplied.

As shown in FIG. 2, these three transistors MX, MY, and MZ act substantially as parallel resistive paths to bias a diode (i.e., the first PMOS transistor MM1) whose current $I_D$ is mirrored in the second PMOS transistor branch, which is connected to the input of the third inverter BI1 (FIG. 1). In response to the appropriate control signal SEL1, another MOS transistor MS enables operation of the current source I1. The second current source I2 of the output buffer circuit of FIG. 1 can be formed in a similar manner, possibly using NMOS transistors in place of the PMOS transistors (i.e., the PMOS transistors MM1 and MM2 are replaced by similar NMOS transistors MM1' and MM2').

The operation of the output buffer circuit of FIG. 1 will now be explained. The level supplied to the second inverter gate BI1 is established by the two MOS transistors MP and MN. The first current source I1 charges and the second current source I2 discharges the output gates of the second inverter BI1, which operates as the buffer. The two current sources are operative in an alternate and exclusive manner when the level logic of the data at the input INP differs from the logic level at the output. When such a condition is verified through the feedback circuit formed by the OR gate OR1 and first AND gate AN2 of the upper branch UB and the second AND gate AN1 and NOR gate NR1 of the lower branch LB, either a charging or discharging current Ix is generated by the first or second current source I1 or I2, respectively.

Thus, the current sources I1 and I2 are only activated during the rising and falling edges of the output signal (i.e., when an inequality condition exists between the input and output nodes INP and OUT). On the other hand, when the signals at the input and output nodes are equal, the selection signals SEL1 and SEL2 do not activate either of the current sources. This reduces energy consumption. As shown in FIG. 1, the signal available at the output OUT of the output buffer circuit is used as the slew rate control signal. In particular, the output signal is compared with the data at the input INP through the OR gate OR1 and first AND gate AN1. If these signals are not equal, one of the two current sources I1 or I2 is activated depending on whether the edge is a rising edge or a falling edge.

More specifically, if the input signal changes from the ground level to the supply voltage level $V_{DD}$, the discharging current source I2 is activated. Thus, the discharge is linearly removed from the second inverter gate BI1 and the gate voltage linearly changes from the supply voltage level $V_{DD}$ to the ground level. Similarly, if the input signal changes from the supply voltage level $V_{DD}$ to the ground level, the charging current source I1 is activated. Thus, the inverter BI1 is driven with a ramp having a slope equal to $Ix/C_{gate}$, where $C_{gate}$ is the capacity of the MOS transistor gate of the second inverter BI1 and $Ix=n*I_D$, where n is the product of the setting factor due to the MOS transistors MX, MY, and MZ and the mirroring multiplier m. Further, the rising time t is given by $t=(C_{gate}*V_{DD})IX$.

Therefore, in the output buffer circuit of FIG. 1, the designer of the current sources I1 and I2 is not required to maintain a constant current Ix when there is a change in temperature, threshold values, or other parameters that are affected by carrier mobility. The selected values that set the current Ix just have to guarantee that the output buffer circuit will operate within the specification limits under all threshold and temperature conditions. In practice, the formula recited above must be multiplied by a factor of between ½ and 1 depending on the real shape of the current Ix waveform, which could even be triangular. In alternative embodiments of the present invention, instead of a resistive path on a MOS diode, a suitable current source is used to minimize the slew rate spread due to temperature, power supply, MOS threshold, and gate capacity. Consequently, there is a modification of the slopes of the output signal edges.

As explained above, the feedback signal that drives one input A of the second AND gate AN1 and the OR gate OR1 is the same as the signal at the output node OUT. In preferred embodiments, the channel lengths of the MOS transistors corresponding to the one input A of these gates AN1 and OR1 should be longer than the minimum length in order to prevent the charge trapped within the gate oxide during an electrostatic discharge from having undesired effects on the conduction of the MOS transistor. Further, an electrostatic discharge protection circuit ESD is provided in order to prevent damage to the logic gates that are directly connected to the output node OUT.

After an edge, the output signal reaches the level of the input signal, and the logic circuit (i.e., the first and second AND gates, the OR gate, and the NOR gate) switches off the current source I1 or I2 that was previously selected by an active selection signal SEL1 or SEL2. Thus, the behavior of the slew rate control circuit SR is similar to a comparator that receives the input signal INP and the output signal OUT and switches on either the upper branch UB or the lower branch LB according to the result of the comparison. In this respect, a logic circuit CMP (FIG. 1) with a comparison function can be identified in the output buffer circuit. The logic circuit CMP is divided into an upper logic circuit CMPU and a lower logic circuit CMPL that control the two current sources I1 and I2 through the two selection signals SEL1 and SEL2. The slew rate speed is controlled (in the sense that it is determined by the current Ix) through the design of the two current sources I1 and I2.

Figure 3:
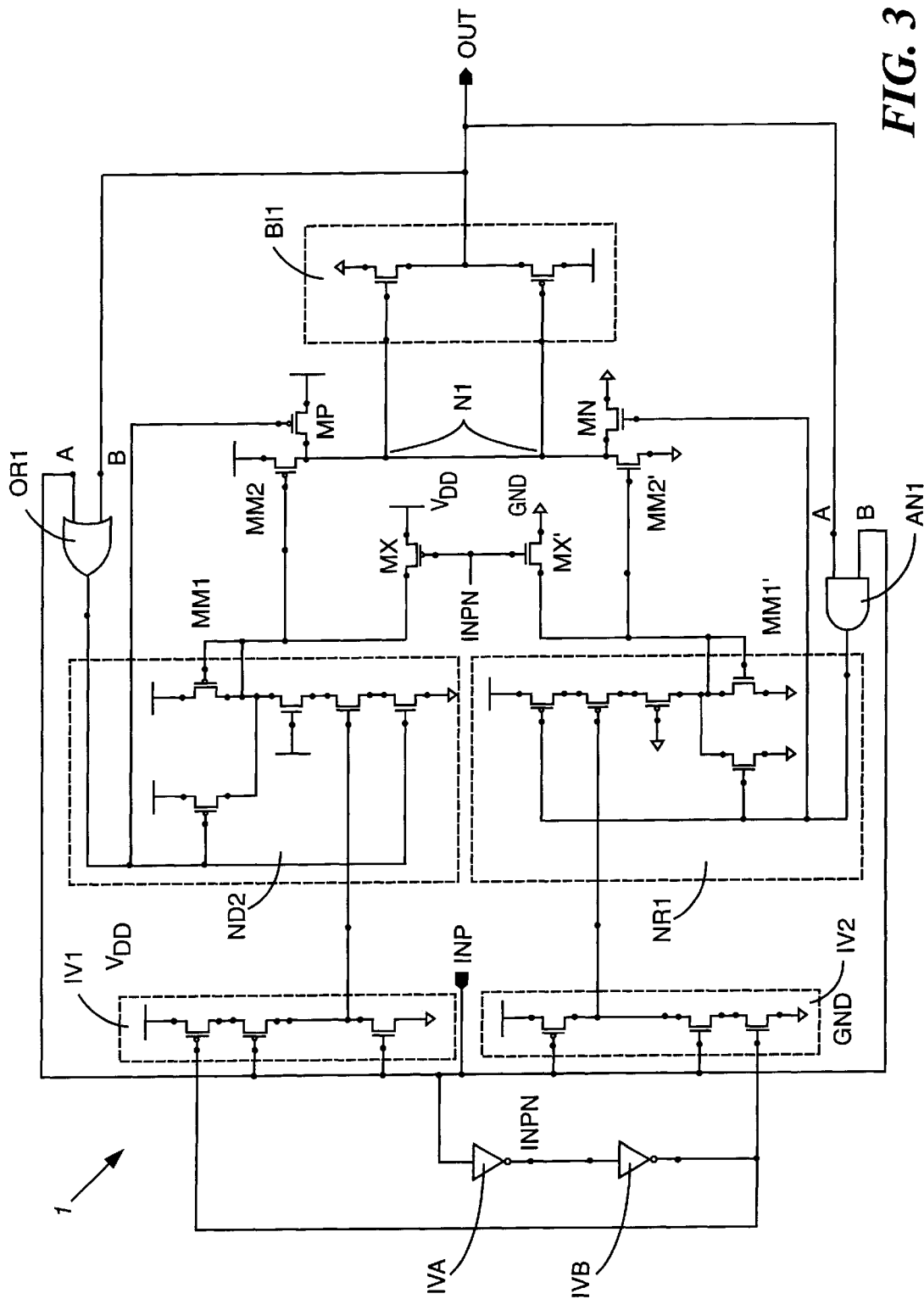
FIG. 3 is a schematic diagram of a CMOS embodiment of the output buffer circuit of FIG. 1.

FIG. 3 shows a detailed CMOS implementation for the output buffer circuit of FIG. 1. As shown, two additional inverters IVA and IVB are placed in series on the input node INP to obtain the complement of the input signal on a node INPN between the inverters and to execute a pre-buffering function. Because of the inherent properties of CMOS logic, a NAND gate ND2 is used in place of the first AND gate AN2 of FIG. 1, and each current source is implemented by using one of the MOS transistors of the corresponding NOR gate NR1 or NAND gate ND2.

Additionally, the input signal complement on the node INPN is applied to the gates of the transistors MX and MX', which operate to bias the diodes in the current mirrors of the current sources I1 and I2. The PMOS transistor MX and the NMOS transistors MX' of the respective branches of the output buffer circuit are connected through the corresponding gate. The input signal complement on the node INPN is used to provide a determined logic level to the gates of the transistors MX and MX' under all conditions and to avoid any fluctuating voltages that could activate the current sources at an undesirable time.

Figure 4:
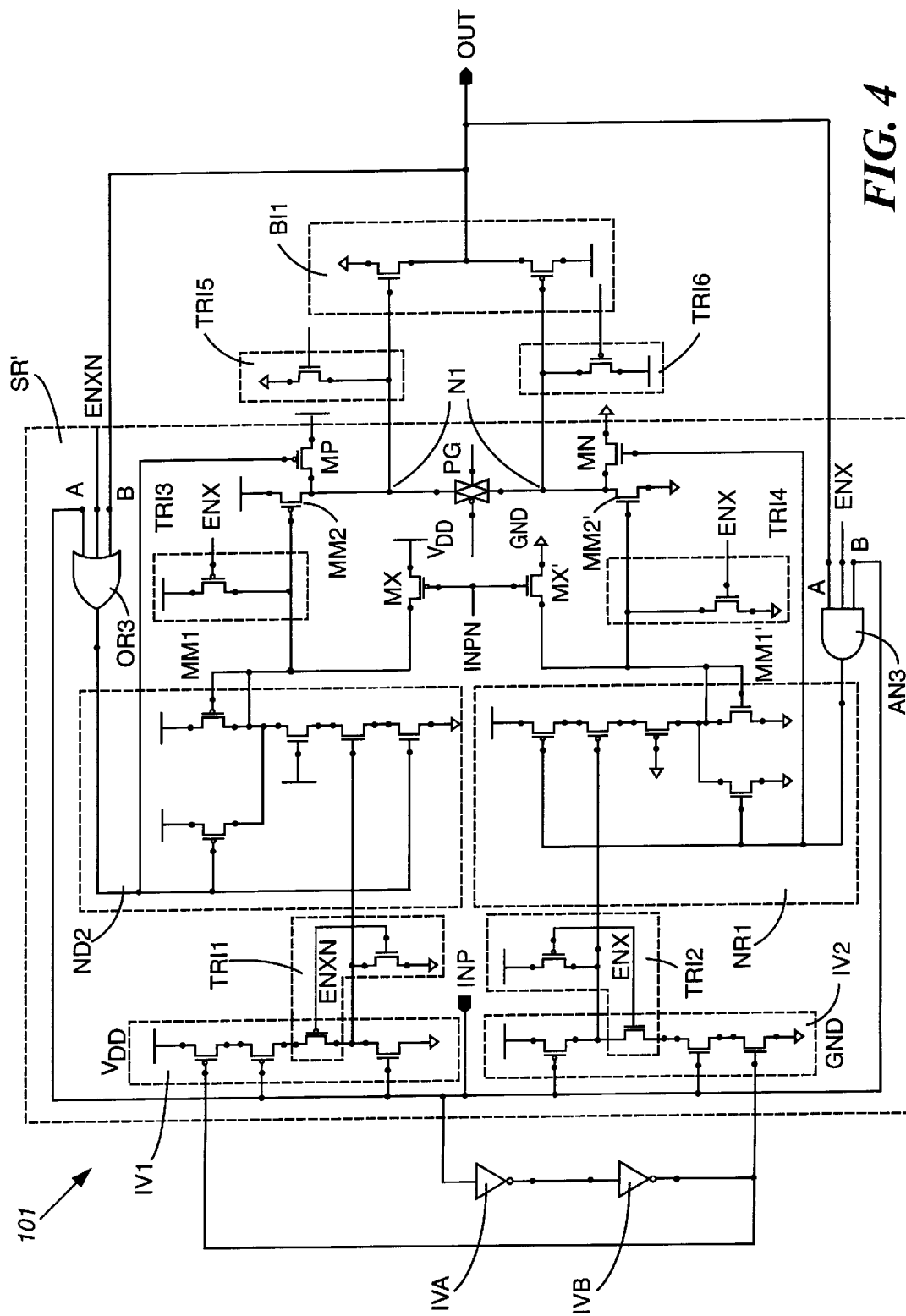
FIG. 4 is a schematic diagram of another CMOS embodiment of the output buffer circuit of FIG. 1.

FIG. 4 shows another CMOS embodiment of the output buffer circuit of FIG. 1. In this embodiment, the output buffer circuit 101 and a corresponding output slew rate control circuit SR' can be placed in a tri-state condition (i.e., a high impedance state). An enable signal ENX and its complementary signal ENXN are provided to enable the tri-state condition. These signals are supplied to the logic gates of the circuit through additional circuits TRI1, TRI2, TRI3, TRI4, TRI5, and TRI6 that each have an NMOS or PMOS transistor to inhibit operation of the MOS transistors of the respective logic gate of the output buffer circuit 101.

For example, the additional circuit TRI5 is formed by an NMOS transistor that is connected between the NMOS transistor of the second inverter BI1 and ground GND. The additional circuit TRI5 receives the enable signal complement ENXN. During operation, a "tri-state" enable condition is provided when the enable signal ENX has a "0" value. In particular, the enable signal complement ENXN then has a "1" value to place the MOS transistor of the additional circuit TRI5 into a conducting condition and bring the NMOS transistor gate in the second inverter BI1 to ground and thus inhibit operation. The PMOS transistor of the additional circuit TRI6 operates in the same manner (i.e., it receives the enable signal to conduct the power supply voltage $V_{DD}$ to the pull-down transistor gate in the second inverter BI1 and thus inhibit operation. Thus, under tri-state conditions, the second inverter BI1 has both transistors inhibited.

The other additional circuits TRI1, TRI2, TRI3, and TRI4 of the output buffer circuit of FIG. 4 operate in the same manner. Furthermore, a pass gate device PG (i.e., a CMOS device that can provide a short circuit or open circuit function based on the enable signal) is interposed on the node N1 of the second inverter BI1 to further insure a high impedance condition. Inputs that receive the enable signal or its complement are also provided for the OR gate OR3 and the AND gate AN3, which are respectively a three-input OR gate and a three-input AND gate, to provide signal feedback from the output node OUT.

The output buffer circuit of the present invention can be fully manufactured using standard CMOS technology for easy integration into integrated circuits. A CMOS closed loop or feedback control is also obtained. Furthermore, with the output buffer circuit of the present invention, the designer does not have to maintain a constant current Ix in the output buffer circuit when there are changes in temperature, threshold values, or the like. Instead, it is sufficient to ensure that the behavior of the buffer circuit stays within the specifications under all threshold and temperature conditions. Therefore, the current sources of the output buffer circuit can be designed using resistive paths to bias a diode, and the resistive paths can be selected with a view to set the value of the current Ix. Additionally, in preferred embodiments, the current sources are only activated during the rising or falling edges of the output signal so current and energy consumption is reduced.

While the embodiments of the present invention described above relate to MOS and CMOS implementations, the output buffer circuit of the present invention can also be implemented using other semiconductor technologies.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. An output buffer circuit comprising:

an input node receiving an input signal;

an output stage;

an output node connected to the output stage, the output node providing an output signal;

an intermediate node connected to the input of the output stage; and a control circuit for controlling voltage variations during rising and falling edges of the output signal, the control circuit receiving the input signal and the output signal, wherein the control circuit compares the level of the input signal and the level of the output signal and drives the output stage by controlling current flow in the intermediate node that is connected to the input of the output stage.

2. The output buffer circuit as defined in claim 1, wherein the control circuit controls voltage variations during the rising and falling edges of the output signal when a transition in the input signal occurs.

3. The output buffer circuit as defined in claim 1, wherein the control circuit includes:
   a first driving circuit for selectively driving the output node;
   a second driving circuit for selectively driving the output node;
   a first logic circuit connected to the input node and the output node, the first logic circuit selectively enabling operation of the first driving circuit; and
   a second logic circuit connected to the input node and the output node, the second logic circuit selectively enabling operation of the second driving circuit.

4. The output buffer circuit as defined in claim 3, wherein the first logic circuit and the second logic circuit recognize the levels of the input signal and the output signal and transitions in the levels of the input signal and the output signal.

5. The output buffer circuit as defined in claim 4,
   wherein the first logic circuit includes a first comparing gate that receives the input signal and the output signal, and
   the second logic circuit includes a second comparing gate that receives the input signal and the output signal.

6. The output buffer circuit as defined in claim 5, wherein the first comparing gate is an OR gate and the second comparing gate is an AND gate.

7. The output buffer circuit as defined in claim 3, wherein the first driving circuit and the second driving circuit selectively allow a current to flow in the intermediate node that is connected to the input of the output stage.

8. The output buffer circuit as defined in claim 7, wherein the first driving circuit injects a current into the intermediate node and the second driving circuit takes a current from the intermediate node.

9. The output buffer circuit as defined in claim 8, wherein a first limiting transistor is connected to the intermediate node and to an output of the first logic circuit, and a second limiting transistor is connected to the intermediate node and to an output of the second logic circuit, so as to establish a steady state voltage level on the intermediate node.

10. The output buffer circuit as defined in claim 9, further comprising a pre-buffering circuit connected to the input node.

11. The output buffer circuit as defined in claim 3, wherein each of the first driving circuit and the second driving circuit is a current source that uses a current mirror connected to resistive paths obtained through transistors.

12. The output buffer circuit as defined in claim 11, further comprising additional circuitry that receives an enable signal and selectively places the output node under a high impedance condition.

13. The output buffer circuit as defined in claim 1, wherein the control circuit is a CMOS control circuit.

14. An output buffer circuit comprising:
   an input node receiving an input signal;
   an output stage;
   an output node connected to the output stage, the output node providing an output signal; and
   a control circuit receiving the input signal and the output signal, the control circuit including comparison circuitry that directly compares the level of the input signal to the level of the output signal and drives the output stage based on the result of the comparison,
   wherein the control circuit controls voltage variations during rising and falling edges of the output signal when a transition in the input signal occurs.

15. The output buffer circuit as defined in claim 14, wherein the control circuit includes:
   a first driving circuit for selectively driving the output node by selectively allowing current flow in an intermediate node that is connected to the input of the output stage;
   a second driving circuit for selectively driving the output node by selectively allowing current flow in the intermediate node;
   a first logic circuit connected to the input node and the output node, the first logic circuit selectively enabling operation of the first driving circuit; and
   a second logic circuit connected to the input node and the output node, the second logic circuit selectively enabling operation of the second driving circuit.

16. The output buffer circuit as defined in claim 14, further comprising:
   at least one current source coupled to the output stage,
   wherein the control circuit activates the at least one current source whenever the comparison circuitry indicates that the input signal is not equal to the output signal.

17. The output buffer circuit as defined in claim 14, further comprising:
   at least two current sources coupled to the output stage,
   wherein the control circuit activates at least one of the current sources whenever the comparison circuitry indicates that the input signal is not equal to the output signal.

18. The output buffer circuit as defined in claim 17,
   wherein the control circuit activates one of the current sources whenever the comparison circuitry indicates that the input signal is not equal to the output signal due to a rising edge of the output signal, and
   the control circuit activates another of the current sources whenever the comparison circuitry indicates that the input signal is not equal to the output signal due to a falling edge of the output signal.

19. A method for slew rate control during rising and falling edges of an output signal of an output buffer circuit, the output buffer circuit receiving an input signal and generating the output signal at an output node that is connected to an output stage, said method comprising the steps of:
   comparing the level of the output signal and the level of the input signal; and
   if the input signal and the output signal have different levels, driving the output stage by injecting a current into or taking a current from an intermediate node that is connected to the input of the output stage.

20. The method for slew rate control as defined in claim 19, wherein the driving step includes the sub-step of controlling a first driving circuit so as to inject a current into the intermediate node or controlling a second driving circuit so as to take a current from the intermediate node.

21. The method for slew rate control as defined in claim 20, further comprising the steps of:
   providing the output signal to a first logic circuit and a second logic circuit; and providing the input signal to the first logic circuit and the second logic circuit, wherein in the comparing step, the level of the output signal and the level of the input signal are compared using the first logic circuit and the second logic circuit.

22. The method for slew rate control as defined in claim 21, wherein the driving step includes the sub-steps of:

controlling the first driving circuit using the first logic circuit when the level of the input signal is "0" and the level of the output signal is "1"; and controlling the second driving circuit using the second logic circuit when the level of the input signal is "1" and the level of the output signal is "0".

23. An information handling system including at least one output buffer circuit, said output buffer circuit comprising:

an input node receiving an input signal;

an output stage;

an output node connected to the output stage, the output node providing an output signal;

an intermediate node connected to the input of the output stage; and a control circuit for controlling voltage variations during rising and falling edges of the output signal, the control circuit receiving the input signal and the output signal, wherein the control circuit compares the level of the input signal and the level of the output signal and drives the output stage by controlling current flow in the intermediate node that is connected to the input of the output stage.

24. The information handling system as defined in claim 23, wherein the control circuit controls voltage variations during the rising and falling edges of the output signal when a transition in the input signal occurs.

25. The information handling system as defined in claim 23, wherein the control circuit includes:

a first driving circuit for selectively driving the output node;

a second driving circuit for selectively driving the output node;

a first logic circuit connected to the input node and the output node, the first logic circuit selectively enabling operation of the first driving circuit; and a second logic circuit connected to the input node and the output node, the second logic circuit selectively enabling operation of the second driving circuit.

* * * * *

UNITED STATES PATENT AND TRADEMARK OFFICE
CERTIFICATE OF CORRECTION

PATENT NO : 6,160,416
DATED : December 12, 2000
INVENTOR(S) : Francesco Adduci, et al.

It is certified that error appears in the above-identified patent and that said Letters Patent are hereby corrected as shown below:

ON THE TITLE PAGE
Under Foreign Application Priority Data, please change "TO97A1060" to --TO97A001060--.

Signed and Sealed this

Twenty-ninth Day of May, 2001

NICHOLAS P. GODICI

Attest:

Attesting Officer          Acting Director of the United States Patent and Trademark Office